United States Patent [19]

Peters

[11] Patent Number: 4,481,644
[45] Date of Patent: Nov. 6, 1984

[54] DIFFERENTIAL PULSE CODE MODULATION TRANSMISSION SYSTEM

[75] Inventor: Joseph H. Peters, Eindhoven, Netherlands

[73] Assignee: U.S. Philips Corporation, New York, N.Y.

[21] Appl. No.: 434,982

[22] Filed: Oct. 18, 1982

[30] Foreign Application Priority Data

Nov. 17, 1981 [NL] Netherlands ............... 8105196

[51] Int. Cl.³ .............................................. H04N 7/12
[52] U.S. Cl. .................................... 375/27; 358/135
[58] Field of Search ........................... 375/27, 30, 31; 358/133, 135, 260; 332/11 D

[56] References Cited

U.S. PATENT DOCUMENTS 4,075,655  2/1978  Iijima et al. ...................... 375/31
4,255,763  3/1981  Maxemchuk et al. ........... 358/135

Primary Examiner—Benedict V. Safourek
Attorney, Agent, or Firm—Thomas A. Briody; Willian J. Streeter; Edward W. Goodman

[57] ABSTRACT

Differential pulse code modulation transmission system in which the transmitter and the receiver each comprise a prediction circuit for generating a prediction signal from the transmitted DPCM-signal. This prediction circuit is in the form of two or more prediction channels $710(i)$ each consisting of a non-linear network $711(i)$ followed by a leaky integrator circuit $700(i)$. The inputs of these prediction channels are connected to a common input 701 and the output of each prediction channel is connected to an input of a summing device 712, which produces the desired prediction signal.

2 Claims, 12 Drawing Figures

| e(n) | d(n) ; d'(n) | c(n) ; c'(n) |
|---|---|---|
| +24 ⟷ +255 | +32 | +4 |
| +13 ⟷ +23 | +18 | +3 |
| +5 ⟷ +12 | +8 | +2 |
| 0 ⟷ +4 | +2 | +1 |
| −1 ⟷ −4 | −2 | −1 |
| −5 ⟷ −12 | −8 | −2 |
| −13 ⟷ −23 | −18 | −3 |
| −24 ⟷ −255 | −32 | −4 |

DIFFERENTIAL PULSE CODE MODULATION TRANSMISSION SYSTEM

BACKGROUND OF THE INVENTION (1) Field of the Invention

The invention relates to a transmission system comprising a transmitter and a receiver, for transmitting an information signal, a video signal in particular, in a digital format obtained by means of differential pulse code modulation (DPCM). The transmitter of this system comprises a DPCM-encoding arrangement and the receiver a DPCM-decoding arrangement.

(2) Description of the Prior Art

The transmitter of a transmission system generally comprises a source supplying an information signal in the analog or digital form and which must be transmitted to the associated receiver. In a DPCM-transmission system, this information signal is first applied to a source encoding circuit which here is in the form of a DPCM-coding arrangement. This coding arrangement comprises a difference producer to which the information signal and a prediction signal are applied and produces a difference signal. This difference signal is applied to a quantizing arrangement producing a quantized difference signal. In addition, the DPCM-encoding arrangement comprises a prediction circuit having an input and an output. The quantized difference signal is applied to the input of this prediction circuit and the prediction signal occurs at its output.

The quantized difference signal occurring at the output of the quantizing arrangement is further applied to a channel encoding circuit, for example an analog-to-digital converter or a code converter, which converts this quantized difference signal into a digital channel signal which will be denoted DPCM signal hereinafter and consists of a sequence of codewords occurring at a predetermined rate $f_s$, denoted the sampling frequency. It should be noted that the inverse quantity $1/f_s$ will be denoted the sampling period and will be indicated by the symbol T.

Via a transmission medium, the codewords produced by the channel coding circuit are transmitted to the associated receiver, where the sequence of received codewords are converted in a channel decoding circuit into a decoded channel signal which, the transmission not being disturbed, accurately corresponds to the original quantized difference signal. This decoded channel signal is further applied to a DPCM-decoding arrangement. This decoding arrangement comprises a summing device to which the decoded channel signal and a second prediction signal are applied and which produces a sum signal. This DPCM-decoding arrangement further comprises a second prediction circuit having an input and an output. The decoded channel signal being applied to this input and the second prediction signal occurring at this output. The prediction circuit in the transmitter is of the same construction as the prediction circuit in the receiver, in order to achieve that the sum signal accurately corresponds to the original information signal.

A prediction circuit can be implemented in several different ways. Possible implementations are described in, for example, the References 1, 2, 3, 4, 5 and 6. As will be apparent from these References, such a prediction circuit is generally formed by an integrator circuit the input of which is connected to the input of the prediction circuit and the output to the output of the prediction circuit.

In the receiver, every received codeword now contributes during a predetermined time interval to the sum signal. If now a codeword is disturbed in the transmission medium, then also the sum signal is disturbed during an equally long time interval. This time interval is closely related to the time constant of the integrator circuit. If it has an infinitely long time constant (in that case the integrator circuit is sometimes called an ideal integrator circuit) then, after the occurrence of a transmission error the sum signal will never obtain its proper value again. In such a case it is customary periodically to adjust the prediction circuit of the DPCM-coding and decoding arrangement (for example at the end of every TV-line) to a fixed value.

If the time constant of the integrator circuit is chosen shorter (in that case the integrator circuit is sometimes called a leaky integrator circuit), also the said time interval becomes shorter. However, reducing the time constant results in a decrease of TV-picture quality. The highest picture quality is obtained when an ideal integrator circuit is used. If, however, a leaky integrator circuit is used, the leak factor will always be a compromise between the length of the time interval (that is to say the speed with which a transmission error is eliminated) and the loss in picture quality.

In order to yet obtain in a DPCM-transmission system using an ideal integrator circuit, that the influence of a disturbed codeword is eliminated in a very short period of time, references 7, 8 and 9 propose to add in the transmitter an error reduction signal to the DPCM-signal. This error reduction signal is then generated by an error reduction circuit to which the information signal to be transmitted, or the prediction signal is applied. In the associated receiver an error reduction signal is subtracted from the received sum signal in order to generate the original DPCM-signal. Also this error reduction signal generated in the receiver is produced by an error reduction circuit to which a signal generated in the DPCM-decoding arrangement is applied, and which, when the transmission being undisturbed, corresponds to the best possible extent to the error reduction signal generated in the transmitter.

SUMMARY OF THE INVENTION

The invention has for its object to shorten considerably, in a DPCM-transmission system using prediction circuits and comprising a leaky integrator circuit, the above-mentioned time interval during which a disturbed codeword negatively affects the sum signal, without a deterioration of the picture quality.

According to the invention, both the prediction circuit in the DPCM-coding arrangement and the prediction circuit in the DPCM-decoding arrangement include two or more prediction channels each consisting of a non-linear network followed by a leaky integrator circuit, the input of each non-linear network being connected to the input of the prediction circuit, all the integrator circuits being of a similar implementation, an unique system of weighting factors being associated with each integrator circuit, the outputs of these integrator circuits being connected to inputs of an adder device the output of which is connected to the output of the prediction circuit.

REFERENCES

1. An experimental differential p.c.m. encoder-decoder for Viewphone signals: G. A. Gerrard, J. E. Thomson; The Radio and Electronic Engineer, Vol. 43, No. 3, March 1973, pages 201–208.
2. Differential PCM for Speech and Data signals; J. B. O'Neal, R. W. Stroh, IEEE Transactions on Communications, Vol. COM-20, No. 5, October 1972, pages 900–912 (FIG. 1 in particular).
3. Differential Pulse Code Modulation with Two-Dimensional Prediction for Video Telephone Signals; T. Thoma; Nachrichtentechnische Zeitschrift, Vol. 27, No. 6, 1974, pages 243–249 (FIGS. 6a, b, c in particular).
4. Predictive Quantizing of Television Signals; R. E. Graham; IRE Wescon Convention Record, Part IV, August 1958, pages 147–156 (FIG. 6 in particular).
5. Digital Image Processing; W. K. Pratt; John Wiley and Sons, 1978 (ISBN 0-471-01888-0), pages 641–657.
6. Dreidimensional DPCM mit Entropiecodierung und adaptiven Filter; J. Burgmeier; Nachrichtentechnische Zeitschrift, Vol. 30, No. 3, 1977, pages 251–254.
7. Hybrid D-PCM for Joint Source/Channel Encoding; Th. M. M. Kremers, M. C. W. van Buul; Tijdschrift voor het Nederland Elektronika- en Radiogenootschap, Vol. 44, nos. 5/6, pages 257–261.
8. Transmission System by Means of Time Quantization and Trivalent Amplitude Quantization; U.S. Pat. No. 4,099,122 dated July 4, 1978; said Patent Specification is equivalent to Netherlands Patent Application No. 7506987.
9. Hybrid D-PCM, A combination of PCM and DPCM; M. C. W. van Buul, IEEE Transactions on Communications, Vol. COM-26, No. 3, March 1978, pages 362–368.

SHORT DESCRIPTION OF THE FIGURES

Figures 4, 7:
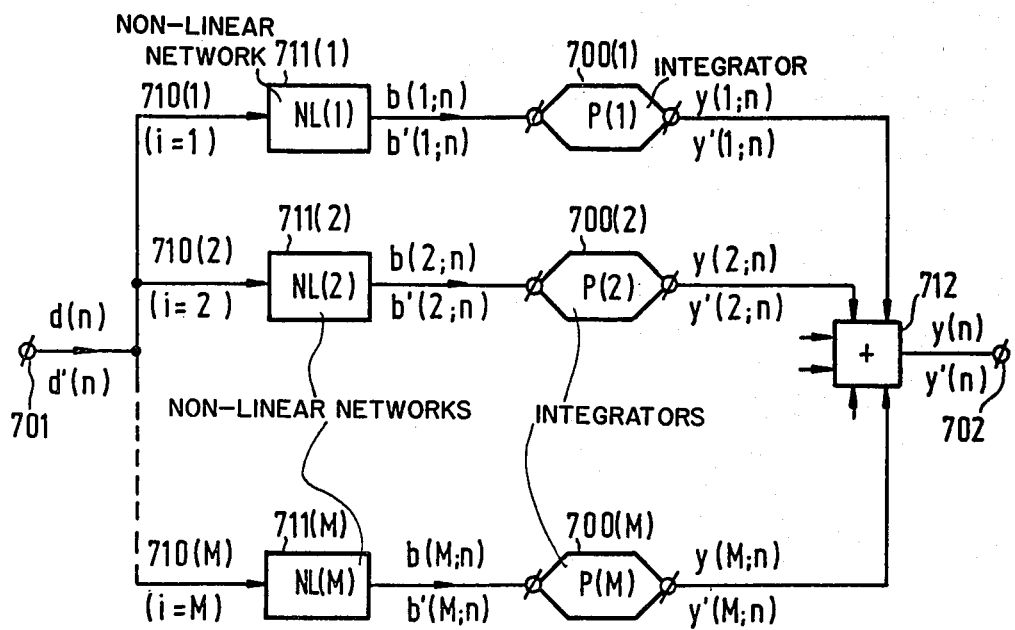
FIG. 4 shows, in the form of a Table, the relationship between several signals occurring in the transmitter and the receiver of the DPCM-transmission system.
Figure 5:
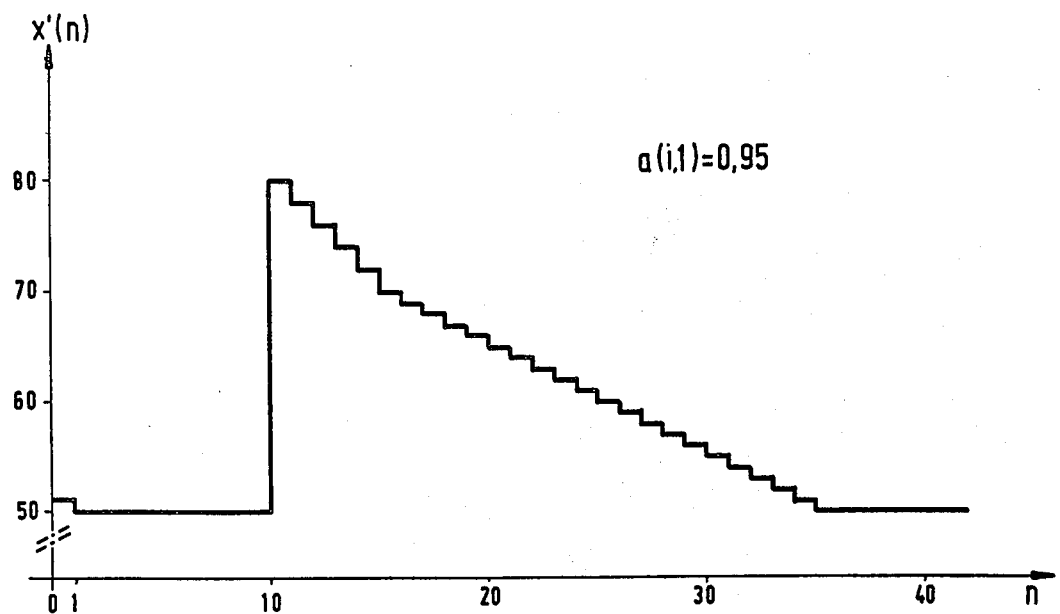
Figure 6:
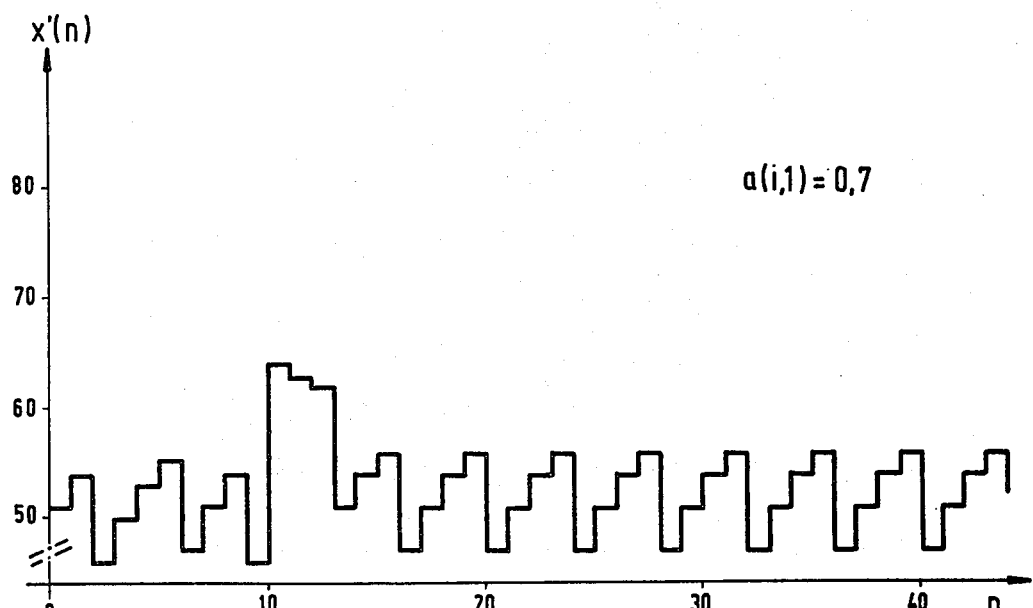
Figure 8:
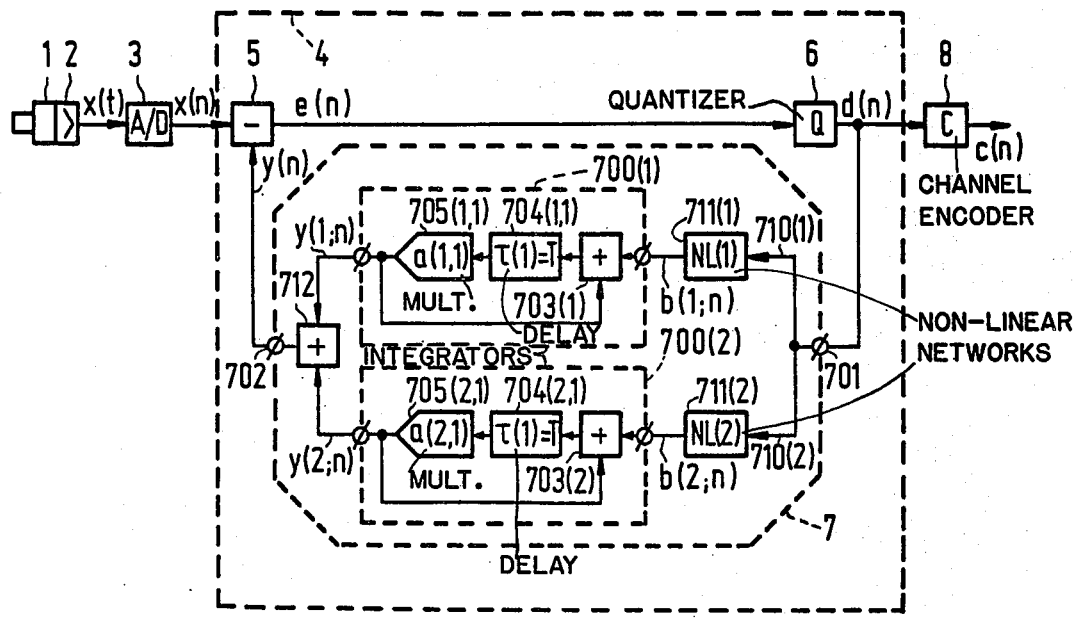
Figure 9:
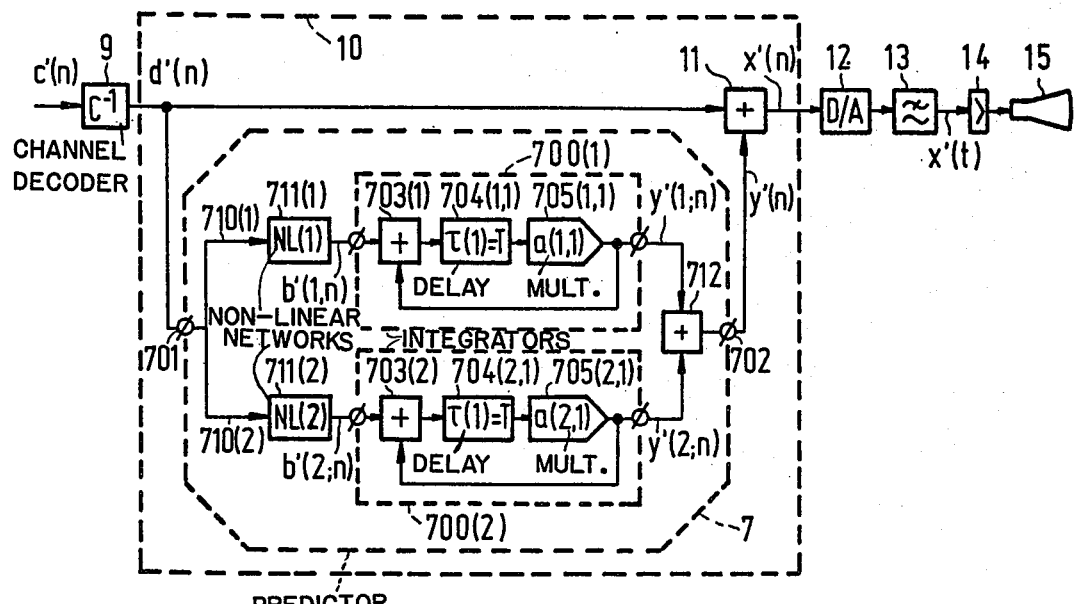
Figure 10:
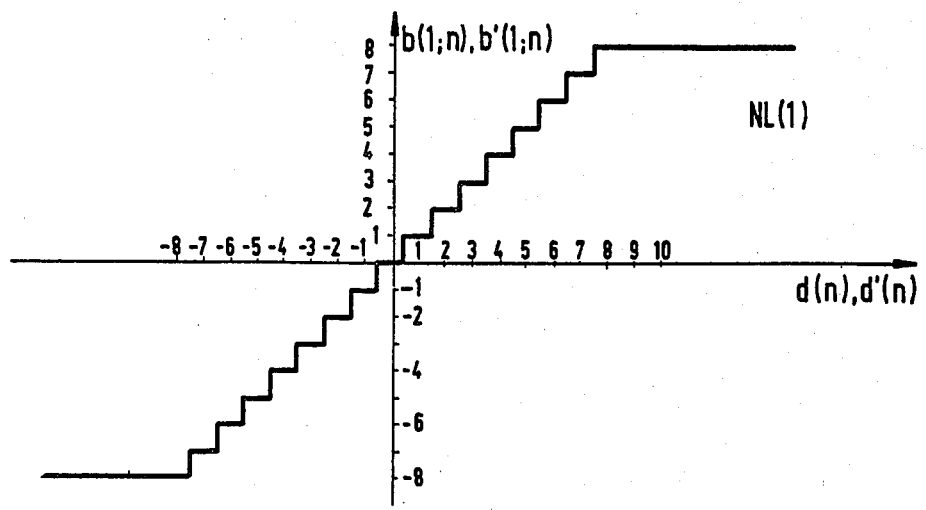
Figure 11:
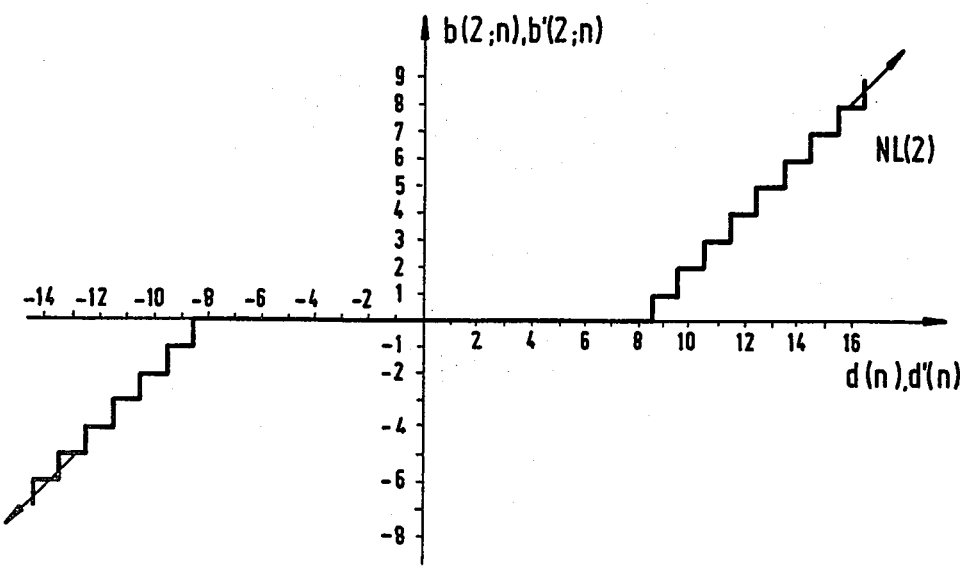
Figure 12:
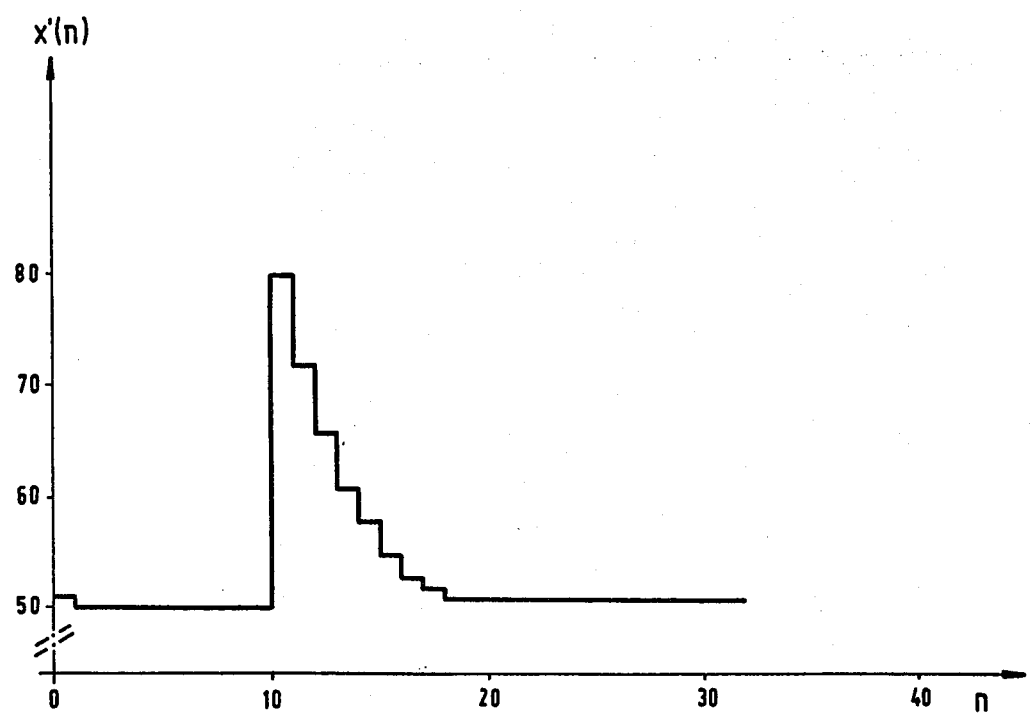

FIG. 5 and FIG. 6 each show a diagram to illustrate the operation of the prior art DPCM-transmission system;

FIG. 7 shows a prediction circuit implemented in accordance with the invention;

FIG. 8 shows a transmitter and FIG. 9 shows a receiver for the DPCM-transmission system in accordance with the invention;

FIG. 10 and FIG. 11 each show the transfer characteristic of a non-linear network used in the transmission systems shown in FIG. 8 and FIG. 9; and FIG. 12 shows a diagram to illustrate the operation of the transmission system.

DESCRIPTION OF THE EMBODIMENTS (1) The prior art transmission system

Although, as is known, DPCM-coding and decoding arrangements can be implemented in different ways, the following description will be limited to the digital implementation.

Figure 1:
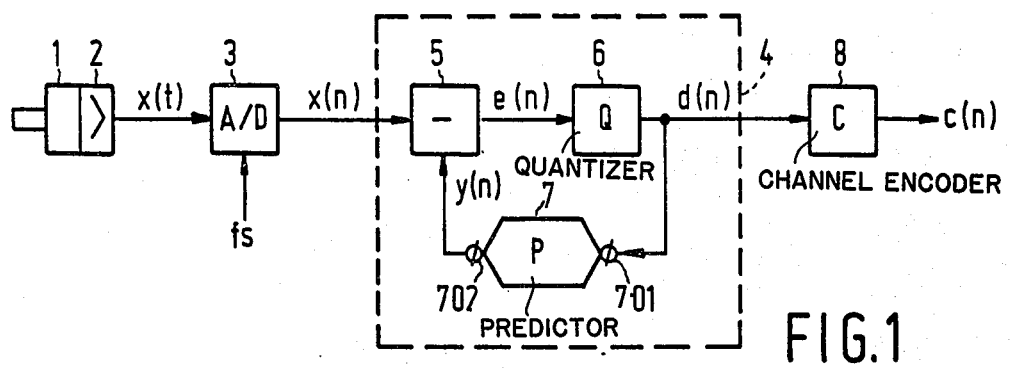
FIG. 1 shows a transmitter of a conventional DPCM-transmission system.

FIG. 1 shows an embodiment of a transmitter of the prior art DPCM-transmission system. This transmitter comprises a TV camera 1 with incorporated video amplifier 2 producing an analog video signal x(t). This video signal is applied to an analog-to-digital converter 3, which produces the digital video signal x(n). This analog-to-digital converter 3 is controlled by sampling pulses occurring with a period T. This digital video signal x(n) now represents the information signal to be transmitted to an associated receiver. For an optimum use of the capacity of the transmission medium, this information is subjected to a source encoding operation. For that purpose, this information signal is applied to a DPCM-encoding arrangement 4 which comprises a difference producer 5 to which x(n) and a prediction signal y(n) are applied and which produces a difference signal $e(n) = x(n)$. This difference signal is applied to a quantizing arrangement 6 which, as is customary, has a non-linear quantizing characteristic and converts this difference signal into a quantized difference signal d(n). This quantized difference signal d(n) is applied to a prediction circuit 7, which has an input 701 and an output 702 and produces the prediction signal y(n). In addition, the quantized difference signal d(n) is subjected to a channel encoding operation and for that purpose is applied to a channel encoding circuit 8, which produces the desired DPCM-signal or channel signal c(n) which is transmitted to the receiver.

Figure 2:
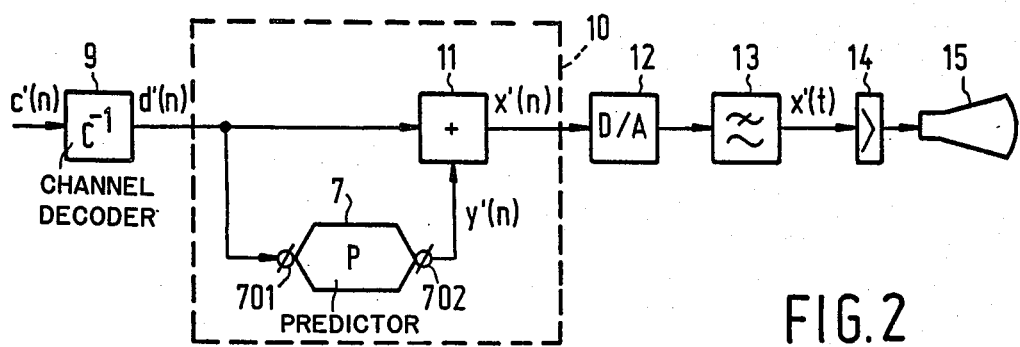
FIG. 2 shows a receiver for the transmitter of FIG. 1.

The receiver shown in FIG. 2 comprises a channel decoding circuit 9 to which the received version c'(n) of the digital channel signal c(n) is applied. This channel decoding circuit 9 operates in a manner which is the opposite of the operation of the channel encoding circuit 8 and it produces the decoded channel signal d'(n), which corresponds to the quantized difference signal d(n). This signal d'(n) is now further applied to a DPCM-decoding device 10, which comprises a summing device 11 to which the signal d'(n) as well as a prediction signal y'(n) are applied for generating a sum signal x'(n) which corresponds to the original digital information signal x(n). The prediction signal y'(n) corresponds to the prediction signal y(n) and is derived from the signal d'(n) by means of a prediction circuit. As the prediction circuit in the receiver is perfectly identical to the prediction circuit 7 in the transmitter, the prediction circuit in the receiver is also denoted by the reference numeral 7. For further processing, the sum signal x'(n) is applied to a digital-to-analog converter 12, whose output is connected to the input of a low-pass filter 13 producing the analog video signal x'(t), which corresponds to the analog video signal x(t), and which is applied to a display tube 15 via a video amplifier 14.

Figure 3:
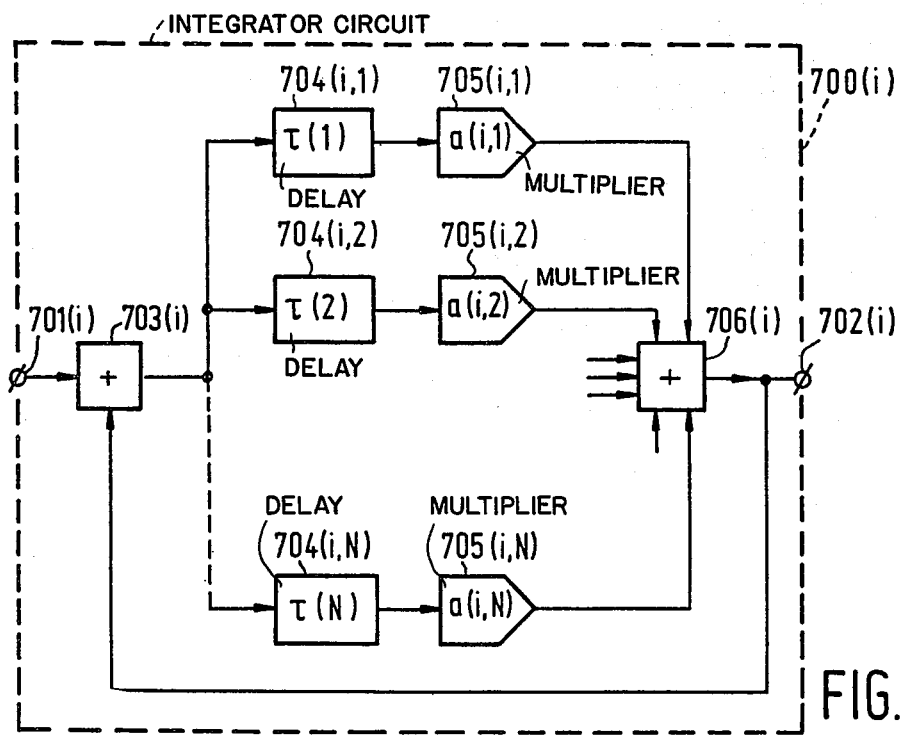
FIG. 3 shows an embodiment of an integrator circuit for use in the DPCM-transmission system.

FIG. 3 shows an embodiment of an integrator circuit to which the reference numeral 700(i) is given. It has an input 701(i) and an output 702(i). In addition, it comprises a first summing device 703(i) a first input of which is connected to the input 701(i). The output of this summing device is connected to inputs of a second summing device 706(i) via N delay devices 704(i, k), a constant-factor multiplier 705(i,k) being coupled in cascade to each of the delay devices 704(i, k). The output of this second summing device 706(i) is connected to the second input of the first summing device 703(i), and also to the output 702(i) of the integrator circuit 700(i). It should be noted that for the quantity k it holds that: k = 1, 2, 3, ... N.

A group of weighting factors a(i,k) is associated with the circuit 700(i) shown in FIG. 3. This means that a weighting factor a(i,k) is associated with the constant factor multiplier 705(i,k), as a result of which the output signal of the delay device 704(i,k) is multiplied by the constant weighting factor a(i,k). Such a weighting factor is equal to or greater than zero and equal to or less than one. As is generally known, what is commonly referred to as an ideal integrator circuit is obtained if the mathematical sum of all the weighting factors associated with the system is equal to unity. If this sum is less than one, a what is commonly referred to as a leaky integrator circuit is obtained.

The delay device 704(i,k) has a time delay which will be designated $\tau(k)$. In practice, in which N will usually not be chosen greater than three, it then holds, for example, that $\tau(1)=T$, $\tau(2)=H$ and $\tau(3)=H+T$. Herein H represents a line period.

In known embodiments of the DPCM transmission system, the prediction circuit 7 comprises only one integrator circuit, for example of the type shown in FIG. 3, so that the input 701(i) and the output 702(i), respectively, of this integrator circuit is connected to the input 701 and to the output 702, respectively, of the prediction circuit 7. As regards the prior art DPCM-transmission system implemented in this way, let the following be assumed.

1. For the system of weighting factor associated with the integrator circuit it holds that: $a(i,k)=0$, for $k \neq 1$, or, which amounts to the same, $N=1$ and that $\tau(1)=T$. The operation of the transmitter shown in FIG. 1 and the receiver shown in FIG. 2 can be mathematically be described as:

$$y(n) = \{y(n-1) + d(n-1)\}a(i,1)$$

$$e(n) = x(n) - y(n)$$

$$d(n) = Q\{e(n)\} \quad (1)$$

$$y'(n) = \{y'(n-1) + d'(n-1)\}a(i,1)$$

$$x'(n) = y'(n) + d'(n)$$

Herein Q {.} represents the quantizing operation performed by the quantizing arrangement 6.

2. The quantizing operation is effected in accordance with the data included in the Table shown in FIG. 4. This Table must be read as follows. If e(n) has one of the values $+255, +254, +253, \ldots +26, +25, +24$, then it holds that $d(n)=+32$. If e(n) has one of the values $+23, +22, +21, \ldots +15, +14, +13$, then it holds that $d(n)=+18$ etc. For the sake of completeness, this Table also shows the relationship between d(n) and c(n) as well as for c'(n) and d'(n). If more particularly $d(n)=+32$, then it holds that $c(n)=+4$. If, in contrast therewith, $d(n)=+18$, then it holds that $c(n)=+3$ etc. If, inversely $c'(n)=+4$, then it holds that $d'(n)=+32$ etc.

3.

$$0 \leq x(n), y(n), x'(n), y'(n) \leq 2^8 - 1$$
$$-2^8 + 1 \leq e(n) \leq 2^8 - 1$$

If now an information signal x(n), for which it holds that:

$$x(n) = 50 \text{ for } n \leq 0$$

while $c(10) = +4$ due to a transmission error and $$y(O) = 49$$

$$y'(O) = 49,$$

is applied to the DPCM-transmission system thus defined, then the output signal x'(n) of the DPCM-decoding arrangement has the shape shown in FIG. 5 if $a(i,1)=0.95$ and the shape shown in FIG. 6 if $a(i,1)=0.7$.

As can be seen from FIG. 5, for a high value (0.95) of the weighting factor a(i, 1) the output signal x'(n) is constant when the input signal x(n) is constant. However, the influence of a transmission error disappears very slowly. If the weighting factor is chosen small, then, as can be seen from FIG. 6, the influence of a transmission error has indeed disappeared rapidly, but the output signal x'(n) is not constant when the information signal x(n) is constant. For that reason, as mentioned already in the foregoing, the picture quality is unacceptable at a low value of the weighting factor a(i,1).

(2) Improvement of the DPCM-transmission system

The disadvantageous properties, described in the preceding paragraph of the prior art DPCM-transmission system can be eliminated to a very great extent by assembling the prediction circuit in the manner shown in a general way in FIG. 7. The prediction circuit is formed by M prediction channels 710(i) wherein $i=1, 2, \ldots M$, each consisting of a non-linear network 711(i) followed by a leaky integrator circuit 700(i). The non-linear network 711(i) is connected by means of its input to the input 701 of the prediction circuit and thus receives the signal d(n) or d'(n) and produces the signal b(i;n) and b'(i;n), respectively. The last-mentioned signal is applied to the integrator circuit 700(i), which in response to the signal b(i;n) produces the auxiliary prediction signal y(i;n) and in response to the signal b'(i;n) produces the auxiliary prediction signal y'(i;n). In an adder arrangement 712, the auxiliary prediction signals are added together, resulting in the prediction signal y(n) and y'(n), respectively.

All the leaky integrator circuits 700(i) are of the same construction; for example the construction shown in FIG. 3. A unique system of weighting factors is associated with each of the integrator circuits. This means that a group of weighting factors $\{a(i,1), a(i,2), \ldots a(i,N)\}$ associated with the integrator circuit 700(i) is unequal to the group of weighting factors $\{a(m,1), a(m,2) \ldots a(m,N)\}$ associated with the integrator circuit 700(m), if $m \neq 1$. These weighting factors are furthermore chosen such, that: $1(i,1)+a(i,2)+ \ldots a(i,N) > a(m,1) + a(m,2) + \ldots a(m,N)$ for $m \geq i+1$.

The non-linear networks 711(i) are each preferably in the form of a sort of amplitude filter circuit, the relationship between its input signal d(n) and its output signal b(i;n) being mathematically described by the expressions:

$$b(i; n) = \quad (2)$$

$$\begin{cases} 0 & \text{for } |d(n)| \leq A(i-1) \\ \text{sign}\{d(n)\} \cdot [|d(n)| - A(i-1)] & \text{for } A(i-1) < |d(n)| \leq A(i) \\ \text{sign}\{d(n)\} \cdot [A(i) - A(i-1)] & \text{for } |d(n)| > A(i) \end{cases}$$

By replacing in the above expressions b(i;n) by b'(i;n) and d(n) by d'(n), this expression also described the relationship between b'(i;n) and d'(n). In expression (2), A(i) represents a positive constant which is characteristic of the non-linear network 711(i). More specifically, it holds that $A(0)=0$ and that $a(i+1) > A(i)$. The quantity sign $\{d(n)\}$ represents the polarity of d(n).

For the sake of completeness, FIG. 8 shows a transmitter and FIG. 9 a receiver for a DPCM-transmission system using prediction circuits 7 which are assembled in a way which satisfies the general implementation shown in FIG. 7. More specifically, the prediction circuit 7 used in FIG. 8 and in FIG. 9 comprises two (M=2) prediction channels 710(1) and 710(2). The leaky integrator circuits 700(1) and 700(2) used in these prediction channels are each constructed in the way which for N=1 and $\tau(1)=T$ follows from the integrator circuit shown in FIG. 3. For the transmitter shown in FIG. 8 it then holds that $$y(n)=y(1;n)+y(2;n)$$

$$y(1;n)=\{y(1;n-1)+b(1;n-1)\}a(1,1)$$

$$y(2;n)=\{y(2;n-1)+b(2;n-1)\}a(2,1) \quad (3)$$

$$e(n)=x(n)-y(n)$$

$$d(n)=Q\{e(n)\}$$

For the receiver shown in FIG. 9 it then holds that:

$$y'(1;n)=\{y'(1;n-1)+b'(1;n-1)\}a(1,1)$$

$$y'(2;n)=\{y'(2;n-1)+b'(2;n-1)\}a(2,1)$$

$$y'(n)=y'(1;n)+y'(2;n) \quad (4)$$

$$x'(n)=d'(n)+y'(n)$$

As regards the DPCM-transmission system constructed thus, let it now be assumed that:

1. the relationship between the input signal and the output signal of each non-linear network is described by expression (2), in which it is assumed more particularly that $A(0)=0$ and $A(1)=8$. The relationship between $d(n)$ and $b(1;n)$ as well as the relationship between $d'(n)$ and $b'(1;n)$ is shown in FIG. 10. The relationship between $d(n)$ and $b(2;n)$ as well as the relationship between $d'(n)$ and $b'(2;n)$ is shown in FIG. 11.

2. The operation of the quantizing arrangement 6 and that of the channel coding circuit 8 as well as that of the channel decoding circuit 9 are described by the Table shown in FIG. 4.

If now an information signal $x(n)$, for which it holds, as in the foregoing, that:

$$x(n)=50 \text{ for } n\geq 0$$

while $$y(1;0)=50$$

$$y(2;0)=0$$

$$y'(1;0)=49$$

$$y'(2;0)=0,$$

is applied to the DPCM-transmission system thus defined and, owing to a transmission error, $c'(10)=+4$, then the output signal $x'(n)$ of the DPCM-decoding arrangement 10 has the form shown in FIG. 12 if $a(1,1)=0.95$ and if $a(2,1)=0.7$.

A comparison of the signal $x'(n)$ shown in FIG. 12 to the signals shown in FIGS. 5 and 6 shows that in the DPCM-transmission system shown in the FIGS. 8 and 9, the influence of a transmission error disappears vary rapidly without the picture quality being negatively affected thereby.

(3) Final remarks

1. The channel encoding circuit 8 and the channel decoding circuit 9 are well-known to a person skilled in the art. For example, these circuits may be in the form of a memory having a plurality of addressable memory locations in which, for example, for the channel encoding circuit 8, the values of $c(n)$ shown in FIG. 4 are stored. These memory locations are addressable by the signal applied thereto such as, for example, $d(n)$.

2. Also the quantizing arrangement 6 is wellknown to a person skilled in the art. It may, for example, also be in the form of a memory having a plurality of addressable memory locations in which, for example, the values of $d(n)$ shown in FIG. 4 are stored. These memory locations are addressable by the values of $e(n)$ applied thereto.

3. What holds for the channel encoding and the channel decoding circuits as well as for the quantizing arrangement, also holds for the non-linear circuits 711($i$). Also these non-linear circuits may be in the form of a memory having a plurality of addressable memory locations in which, for example, the values following from the FIG. 10 for $b(1;n)$ and $b'(1;n)$ and FIG. 11 for $b(2;n)$ and $b'(2;n)$ are stored. These memory locations are then addressable by the signal $d(n)$ and $d'(n)$, respectively applied thereto.

4. All the non-linear circuits may be combined to form one single memory.

5. The transfer characteristics of the non-linear networks 711($i$) may also be chosen such that they partly overlap. This then means that, for example for predetermined values of $d(n)$ or $d'(n)$ wherein $b(1;n)$ and $b'(i;n)$, respectively is not yet equal to the saturation value $A(i)$, the non-linear network 700($i+1$) already produces an output signal different from zero.

What is claimed is:

1. A differential pulse code modulation (DPCM) transmission system comprising a transmitter and a receiver, wherein:

A. the transmitter comprises:
  a.1. means for generating an information signal to be transmitted,
  a.2. a DPCM-encoding arrangement comprising:
    aa.1. a difference producer to which the information signal to be transmitted is applied via a first input and a first prediction signal via a second input for generating a difference signal;
    aa.2. a quantizing arrangement to which the difference signal is applied and which produces a quantized difference signal,
    aa.3. a first prediction circuit for generating the first prediction signal and having an input to which the quantized difference signal is applied, as well as an output coupled to the second input of the difference producer;
  a.3. a channel-encoding circuit for converting the quantized difference signal into a digital channel signal, B. the receiver comprises:
  b.1. a channel decoding circuit for converting the received digital channel signals into a decoded channel signal,
  b.2. A DPCM-decoding arrangement comprising:

bb.1. a summing device to which the decoded channel signal is applied via a first input and the second prediction signal via a second input, bb.2. a second prediction circuit for generating the second prediction signal and having an input to which the decoded channel signal is applied also having an output coupled to the second input of the summing device;

b.3. means for processing the sum signal produced by the summing device;

C. the first and the second prediction circuits each comprise two or more prediction channels each consisting of a non-linear network followed by a leaky integrator circuit, the input of each non-linear network being connected to the input of the prediction circuit, the integrator circuits all being of the same construction, different sets of weighting factors being associated with each integrator circuit, the output of these integrator circuits being connected to inputs of an adder arrangement whose output is connected to the output of the prediction circuit.

2. A transmission system as claimed in claim 1, wherein, for the prediction channel having number i, the relationship between the input signal $d(n)$ of the non-linear network and its output signal $b(i;n)$ is given by the expression $$b(i;n)$$

$$\begin{cases} 0 & \text{for } |d(n)| \leq A(i-1) \\ \text{sign}\{d(n)\} \cdot [|d(n)| - A(i-1)] & \text{for } A(i-1) < |d(n)| \leq A(i) \\ \text{sign}\{d(n)\} \cdot [A(i) - A(i-1)] & \text{for } |d(n)| > A(i) \end{cases}$$

in which $A(i)$ represents a positive constant with $A(0)=0$ and $A(i+1)>A(i)$ and sign $\{d(n)\}$ represents the polarity of $d(n)$.

* * * * *

UNITED STATES PATENT AND TRADEMARK OFFICE
CERTIFICATE OF CORRECTION

PATENT NO. : 4,481,644

DATED : Nov. 6, 1984

INVENTOR(S) : JOSEPH H. PETERS

It is certified that error appears in the above-identified patent and that said Letters Patent is hereby corrected as shown below:

Column 10, lines 10-15 delete in their entirety.

column 10, lines 10-15 should read as follows:

$$--b(i; n) = \begin{cases} 0 & \text{for } |d(n)| \leq A(i-1) \\ \text{sign}\{d(n)\} \cdot [|d(n)| - A(i-1)] & \text{for } A(i-1) < |d(n)| \leq A(i) \\ \text{sign}\{d(n)\} \cdot [A(i) - A(i-1)] & \text{for } |d(n)| > A(i) \end{cases}$$

Signed and Sealed this

Twenty-third Day of April 1985

[SEAL]

Attest:

DONALD J. QUIGG

Attesting Officer     Acting Commissioner of Patents and Trademarks